US012779388B2

(12) United States Patent
Lin et al.

(10) Patent No.: US 12,779,388 B2
(45) Date of Patent: Nov. 3, 2026

(54) PRE-INTERCEPTION DEVICE AND FILTERING SYSTEM OF ELECTRONIC APPARATUS USING THE SAME

(71) Applicant: CHROMA ATE INC., Taoyuan City (TW)

(72) Inventors: Chia-Lin Lin, Taoyuan City (TW); Chih-Chun Wang, Taoyuan City (TW)

(73) Assignee: CHROMA ATE INC., Taoyuan City (TW)

( * ) Notice: Subject to any disclaimer, the term of this patent is extended or adjusted under 35 U.S.C. 154(b) by 429 days.

(21) Appl. No.: 18/635,059

(22) Filed: Apr. 15, 2024

(65) Prior Publication Data

US 2024/0408532 A1 Dec. 12, 2024

(30) Foreign Application Priority Data

Jun. 8, 2023 (TW) ................................ 112121486

(51) Int. Cl.

| | |
|---|---|
| ***B01D 53/22*** | (2006.01) |
| ***B01D 45/06*** | (2006.01) |
| ***B01D 46/10*** | (2006.01) |
| ***B01D 50/20*** | (2022.01) |
| ***H05K 5/02*** | (2006.01) |

(52) U.S. Cl.

CPC ............ *B01D 50/20* (2022.01); *B01D 45/06* (2013.01); *B01D 46/10* (2013.01); *H05K 5/0214* (2022.08); *B01D 2279/45* (2013.01)

(58) Field of Classification Search

CPC ........ B01D 50/20; B01D 45/06; B01D 46/10; B01D 2279/45; H05K 5/0214

See application file for complete search history.

(56) References Cited

U.S. PATENT DOCUMENTS

| | | | | |
|---|---|---|---|---|
| 2,059,017 A * | 10/1936 | Nickle ................... | B01D 46/10 | 55/503 |
| 2,286,479 A * | 6/1942 | Farr ....................... | B01D 46/10 | 126/299 F |
| 3,993,363 A * | 11/1976 | Skoyles .............. | B60T 8/17633 | 303/176 |
| 4,411,675 A * | 10/1983 | de Castella ............ | B01D 46/10 | 454/67 |

(Continued)

FOREIGN PATENT DOCUMENTS

| | | |
|---|---|---|
| CN | 207307475 U | 5/2018 |
| TW | I736034 | 8/2021 |

*Primary Examiner* — Anthony Shumate
(74) *Attorney, Agent, or Firm* — WPAT, PC

(57) ABSTRACT

A pre-interception device includes an input portion for a fluid to flow in, an output portion for the fluid to flow out, a plurality of diversion flow channels and a plurality of interception portions. Each diversion flow channel is in communication with the output portion and the input portion, is configured to provide turning guidance for flow of the fluid, and has a fluid lift section. The interception portions are configured to form a turbulent flow field in the fluid. The turbulent flow field can have foreign objects flowing through the diversion flow channel be captured. Accordingly, a filtering effect is achieved based on physical properties of the foreign objects. When the pre-interception device is additionally combined with a filter net to form a filtering system, the burden on the filter net is further alleviated, hence extending a service life of the filter net and reducing costs.

14 Claims, 9 Drawing Sheets

(56) References Cited

U.S. PATENT DOCUMENTS

| | | | | | |
|---|---|---|---|---|---|
| 4,466,817 | A * | 8/1984 | Faas | F01N 1/12 | 55/455 |
| 5,098,767 | A * | 3/1992 | Linnersten | B01D 46/10 | 55/497 |
| 5,188,647 | A * | 2/1993 | Brookfield | B01D 45/06 | 55/433 |
| 5,470,363 | A * | 11/1995 | Leader | F24F 13/24 | 55/438 |
| 5,591,253 | A * | 1/1997 | Altman | B04C 5/04 | 96/61 |
| 6,872,311 | B2 * | 3/2005 | Koslow | A61L 2/022 | 210/507 |
| 2004/0108264 | A1 * | 6/2004 | Hajek | B01D 29/35 | 210/488 |
| 2012/0212250 | A1 * | 8/2012 | Tai | B01D 46/10 | 324/762.01 |
| 2013/0160648 | A1 * | 6/2013 | Spryshak | B01D 46/0009 | 55/320 |
| 2016/0175750 | A1 * | 6/2016 | Padovan | F22B 37/26 | 55/440 |
| 2020/0368659 | A1 * | 11/2020 | Flora | B01D 50/20 | |

* cited by examiner

PRE-INTERCEPTION DEVICE AND FILTERING SYSTEM OF ELECTRONIC APPARATUS USING THE SAME

BACKGROUND OF THE INVENTION

Field of the Invention

The present disclosure relates to a pre-interception device, and more particularly to a pre-interception device and a filtering system of an electronic apparatus using the same.

Description of the Prior Art

An application environment of an electronic apparatus may contain numerous minute foreign objects (for example, dust particles, fibers, metal scraps and metal grains). These foreign objects are present in forms of particles, granules, sheets or blocks and in need of being blocked as much as possible (particularly conductive metal scraps and metal grains), so as to prevent these foreign objects from being sucked to the inside of the electronic apparatus along with the operation of a heat dissipation system or other systems of the electronic apparatus, and further preventing apparatus malfunction or damage caused thereby.

A filtering system with a filter net is capable of practicing an outstanding blocking effect against foreign objects. However, the amount of foreign objects accumulated may increase rapidly such that the filter net has to be replaced frequently, otherwise the air intake of the electronic apparatus can be affected due to congestion, hence lowering heat dissipation performance. On the other hand, replacing the filter net too frequently leads to increased costs as well as inconvenience of use.

SUMMARY OF THE INVENTION

In a pre-interception device and a filtering system using the pre-interception device according to some embodiments of the present disclosure, an interception device employing physical properties of foreign objects is arranged to provide a filtering effect for a fluid passing through.

A pre-interception device configured to intercept foreign objects in a fluid passing through is provided according to some embodiments. The pre-interception device includes an input portion for the fluid to flow in, an output portion for the fluid to flow out, a plurality of diversion flow channels and a plurality of interception portions. Each diversion flow channel is in communication with the output portion and the input portion, is configured to provide turning guidance for flow of the fluid, and has a fluid lift section. These interception portions are arranged on an edge of a path of the fluid lift section of each diversion flow channel, so that at least a portion of the fluid flowing through the diversion flow channel can flow through the corresponding interception portion so as to form a turbulent flow field. The turbulent flow field can have the foreign objects flowing through the diversion flow channel be captured in the interception portion.

According to some embodiments, each diversion flow channel can have a first opening arranged at the input portion and a second opening arranged at the output portion, wherein the first opening is lower than the second opening. The fluid lift section is located between the first opening and the second opening. The corresponding interception portion is arranged near the second opening and is located on a lower side of the second opening.

According to some embodiments, the pre-interception device can include a plurality of spacers stacked at intervals. Front sections of the spacers define the input portion, rear sections of the spacers define the output portion, and two adjacent spacers define the diversion flow channel in between. The rear section of each spacer has a reverse folding portion extending upward and protruding forward to form the interception portion.

According to some embodiments, the front section of each spacer can have a portion vertically extending downward, so as to form a part of the input portion together with other adjacent spacers.

According to some embodiments, the front section of each spacer can have an eaves portion obliquely extending downward and outward, so as to form a part of the input portion together with other adjacent spacers.

According to some embodiments, a filtering system of an electronic apparatus is provided. The filtering system includes a pre-interception device and a filter net. The pre-interception device includes an input portion for a fluid to flow in, an output portion for the fluid to flow out and flow into the electronic apparatus, a plurality of diversion flow channels and a plurality of interception portions. Each diversion flow channel is configured to provide turning guidance for flow of the fluid, is in communication with the output portion and the input portion, and has a fluid lift section. The interception portions are arranged on an edge of a path of the fluid lift section of each diversion flow channel, and are configured to have at least a portion of the fluid flowing through the diversion flow channel to flow through the corresponding interception portion so as to form a turbulent flow field. The filter net is arranged on an outer side of the output portion, and is configured to allow the fluid flowing into the electronic apparatus to pass through.

Accordingly, based on the physical properties of foreign objects and by controlling a flow direction and flow field of a fluid, foreign objects with certain special physical properties (for example, with attributes such as being heavy in weight or large in volume) can be captured by the pre-interception device. Thus, such pre-interception device features an advantage of being low-cost. Moreover, when a filter net is additionally provided on a rear section of a flow channel, the burden on the filter net is alleviated and the service life of the filter net is then prolonged.

DETAILED DESCRIPTION OF THE EMBODIMENTS

Objectives, features, and advantages of the present disclosure are hereunder illustrated with specific embodiments, depicted with drawings, and described below.

In the disclosed embodiments, by forcibly changing in a flow direction when a fluid flows in a flow channel of the pre-interception device, certain foreign objects in the fluid can be captured in an additionally created turbulent flow filed due to inertia during the process of changing the flow direction based on physical properties, hence achieving an interception effect. The certain foreign objects refer to objects expected to be eliminated, including solids that are mixed in the fluid and are expected to be eliminated as much as possible, for example, dust, fibers, metal scraps and metal grains. The fluid includes, for example, a gas or a fluid mixed with a liquid and a gas.

Figure 1:
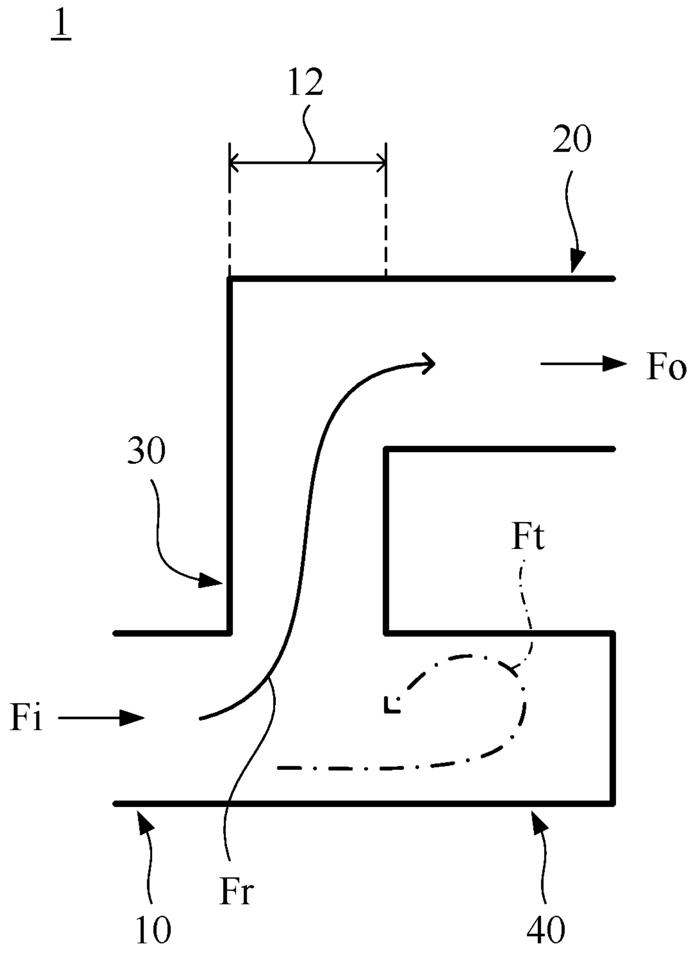
FIG. 1 is a sectional schematic diagram of a portion of a pre-interception device according to some embodiments.

Refer to FIG. 1 showing a sectional schematic diagram of a portion of a pre-interception device according to some embodiments. A portion of a pre-interception device 1 shown in FIG. 1 includes an interception portion 40 and a diversion flow channel 30 having a fluid lift section 12. The interception portion 40 is arranged on one side of the diversion flow channel 30 and near an edge of a path of the fluid lift section 12, and is configured to generate disturbance in the fluid and create a rotating vortex, causing the fluid to form a turbulent flow field herein.

A combination of a plurality of diversion flow channels 30 and the interception portions 40 corresponding to the individual diversion flow channels 30 can construct a body portion (not shown in FIG. 1) of the pre-interception device, so as to divert the fluid passing through and to provide an interception effect against foreign objects. Again referring to the portion of the pre-interception device 1 shown in FIG. 1, the diverted input fluid flows in (forming an input fluid flow direction Fi) from an input portion 10, forms a lifted fluid (forming a lifted fluid flow direction Fr) and a turbulent fluid (forming a turbulent fluid flow direction Ft) in a region of the fluid lift section 12 and the interception portion 40, and is then output from an output portion 20 to form an output fluid (forming an output fluid flow direction Fo). A front end of each diversion flow channel 30 is in communication with the input portion 10 which jointly defines the pre-interception device 1, and a rear end of each diversion flow channel 30 is in communication with the output portion 20 which jointly defines the pre-interception device 1.

As shown in FIG. 1, the diversion flow channel 30 provides turning guidance for the fluid flowing through and constructs the fluid lift section 12, and causes at least a portion of the fluid flowing through to form a turbulent flow filed therein by the adjacent interception portion 40. Thus, such configuration provides an attraction for foreign objects in the fluid. For example, based on physical properties such as being large in volume and/or heavy in weight, certain foreign objects are likely to deviate from the flow direction of the fluid lift section 12 due to inertia during the process of changing the flow direction and be further captured in the interception portion 40 based on the effect of the turbulent flow field, hence achieving an interception effect against foreign objects by the interception portion 40.

Furthermore, when foreign objects in the interception portion 40 have been accumulated to a certain amount and have to be cleaned, in order to preserve the intercepted foreign objects in the interception portion 40 as much as possible and to extend a cycle of cleaning the interception portion 40, the shape and/or material of an inner surface of the interception portion 40 can be configured to gather the intercepted foreign objects. For example, a bottom of the interception portion 40 is further provided with a recess for accommodating foreign objects and/or a bottom of the interception portion 40 is further provided with a configuration for easily capturing foreign objects (for example, a spiny structure on a bottom surface and/or a magnet for attracting metal).

Figure 2:
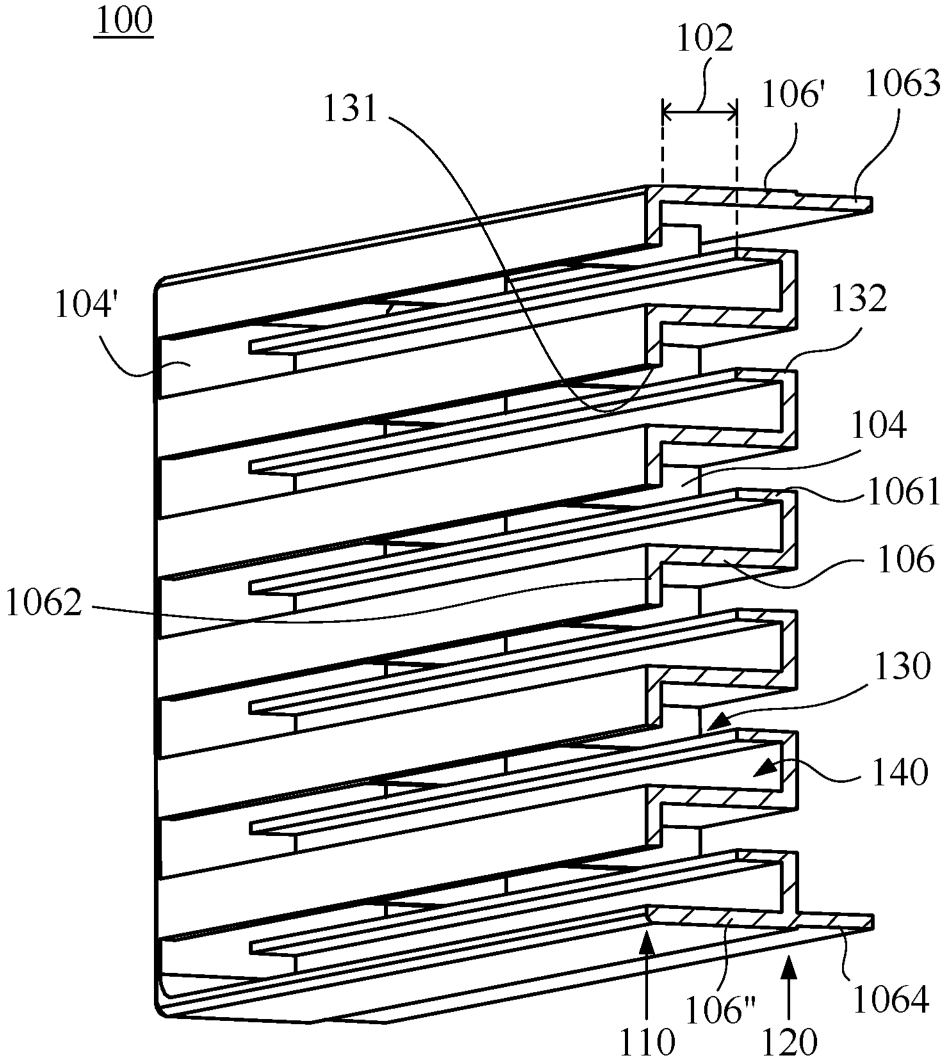
FIG. 2 is a perspective sectional schematic diagram of a pre-interception device according to a first implementation form of some embodiments.
Figure 3:
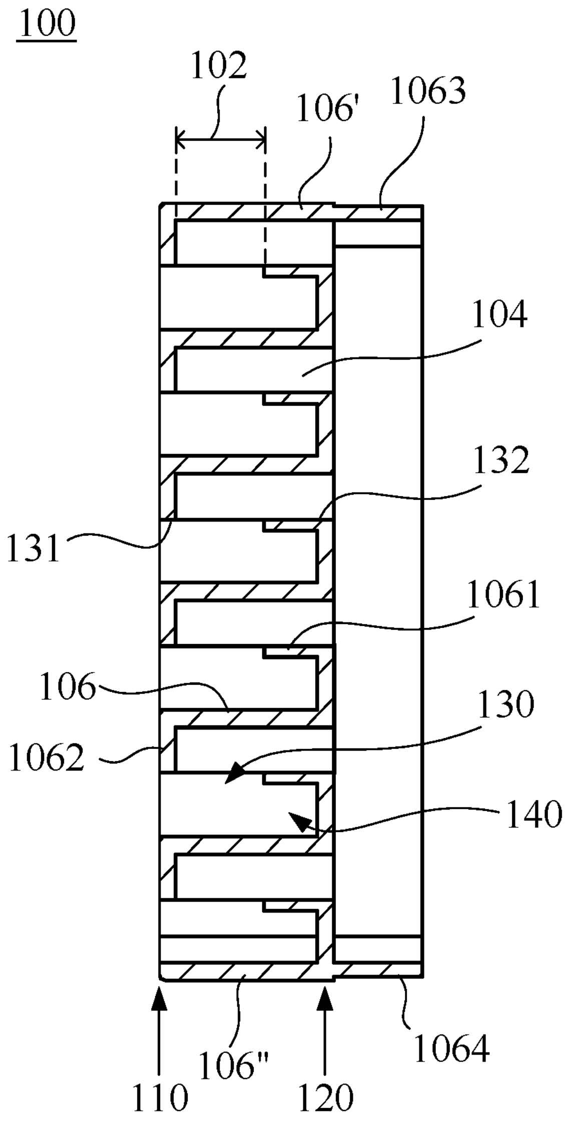
FIG. 3 is a sectional schematic diagram of the implementation form in FIG. 2.
Figure 4:
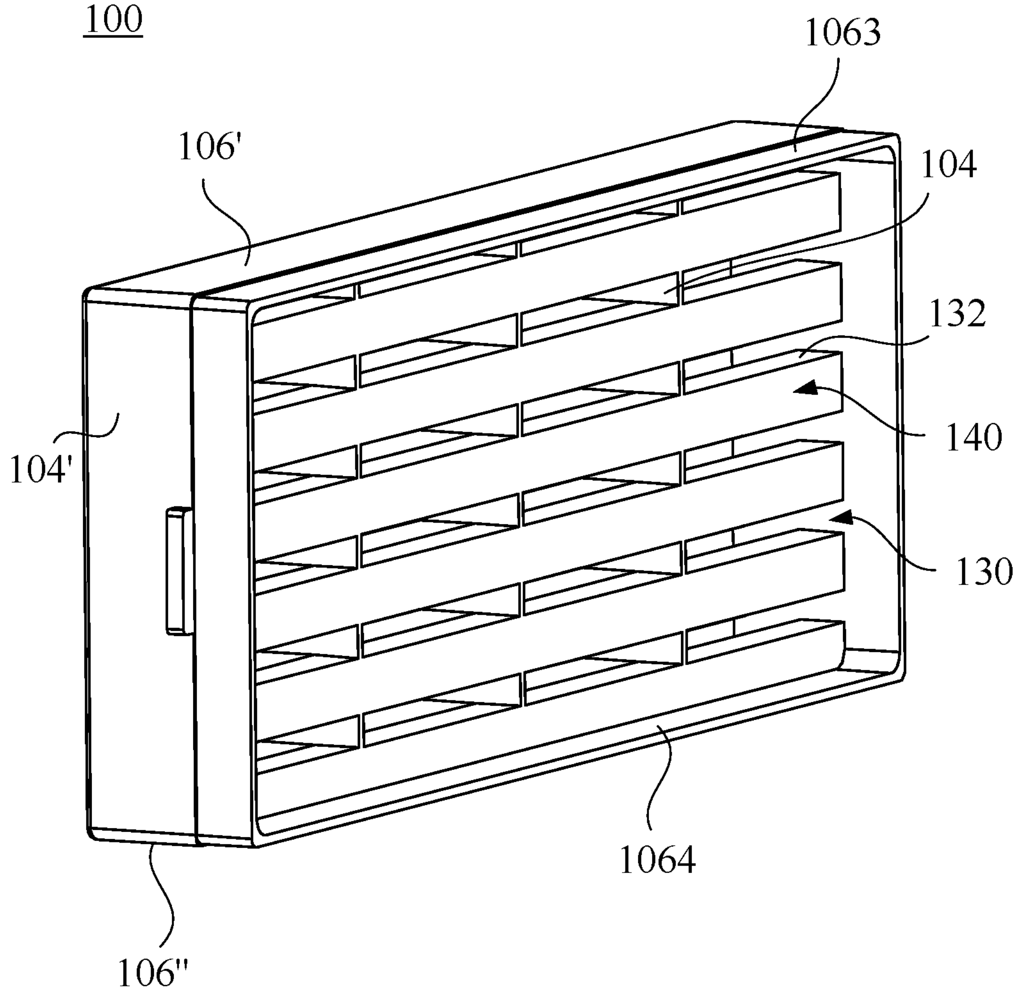
FIG. 4 is a perspective schematic diagram from a rear perspective of the implementation form in FIG. 2.

Referring to FIG. 2, FIG. 3 and FIG. 4, FIG. 2 shows a perspective sectional schematic diagram of a pre-interception device according to a first implementation form of some embodiments, FIG. 3 shows a sectional schematic diagram of the implementation form in FIG. 2, and FIG. 4 shows a perspective schematic diagram from a rear perspective of the implementation form in FIG. 2.

A pre-interception device 100 of the first implementation form includes individual diversion flow channels 130 in a stack, such that a fluid flowing into the pre-interception device 100 is diverted into the individual diversion flow channels 130, and foreign objects are intercepted by fluid lift sections 102 and interception portions 140. On the basis of the configuration of the diversion flow channels 130 in a stack, in each diversion flow channel 130, a first opening 131 is provided on a front end to form a portion of an input portion 110, and a second opening 132 is provided on a rear end to form a part of an output portion 120. In each diversion flow channel 130, the first opening 131 is arranged to be lower than the second opening 132, the fluid lift section 102 is thus defined on the flow channel between the first opening 131 and the second opening 132, and the corresponding interception portion 140 is arranged at a position near the second opening 132 and located on a lower side of the second opening 132.

In the pre-interception device 100, a plurality of spacers 106 stacked at intervals can be supported by a plurality of ribs 104, so as to form a spaced arrangement. These ribs 104 include, for example but not limited to, borders 104' located on two end edges of the spacers 106 to further form the pre-interception device 100. By connecting the individual spacers 106 by the ribs 104, the structure of the pre-interception device 100 is constructed, and the sizes of the individual diversion flow channels 130 are also defined. For example, the size of the corresponding diversion flow channel 130 gets large as a distance between two adjacent spacers 106 increases. Similarly, on the basis of the arrangement in a stack, front sections of these spacers 106 define the input portion 110, rear sections of these spacers 106 define the output portion 120, and two adjacent spacers 106 define each diversion flow channel 130 in between.

Regarding the corresponding interception portion 140 of each diversion flow channel 130, in the first implementation form, the rear section of the spacer 106 is provided with a reverse folding portion 1061 extending upward and protruding forward (toward the side of the input portion 110) to form the interception portion 140. Moreover, the front section of the spacer 106 is provided with a portion 1062 vertically extending downward, so as to form a part of the input portion 110 together with the adjacent spacer 106.

A spacer 106' on an uppermost layer is not provided with the reverse folding portion 1061, but is further provided with a first extension portion 1063. Correspondingly, a spacer 106" on a lowermost layer is not provided with the portion 1062 vertically extending downward, but is further provided with a second extension portion 1064. In some applications, in addition to mounting with a housing of a back-end electronic apparatus, apart from connecting members for fastening or packing for assembly, the first extension portion 1063 and the second extension portion 1064 can also coordinate with the borders 104' to provide a position for arranging a filter net.

Furthermore, referring to FIG. 3, a position of an upper surface of the reverse folding portion 1061 can be arranged substantially (with a minute difference or even substantially equal to) on a lower edge of the portion 1062 vertically extending downward. In addition to forming good fluid lift sections 102, the arrangement above is also beneficial for construction costs for the structure of the integrally formed pre-interception device 100.

Figure 5:
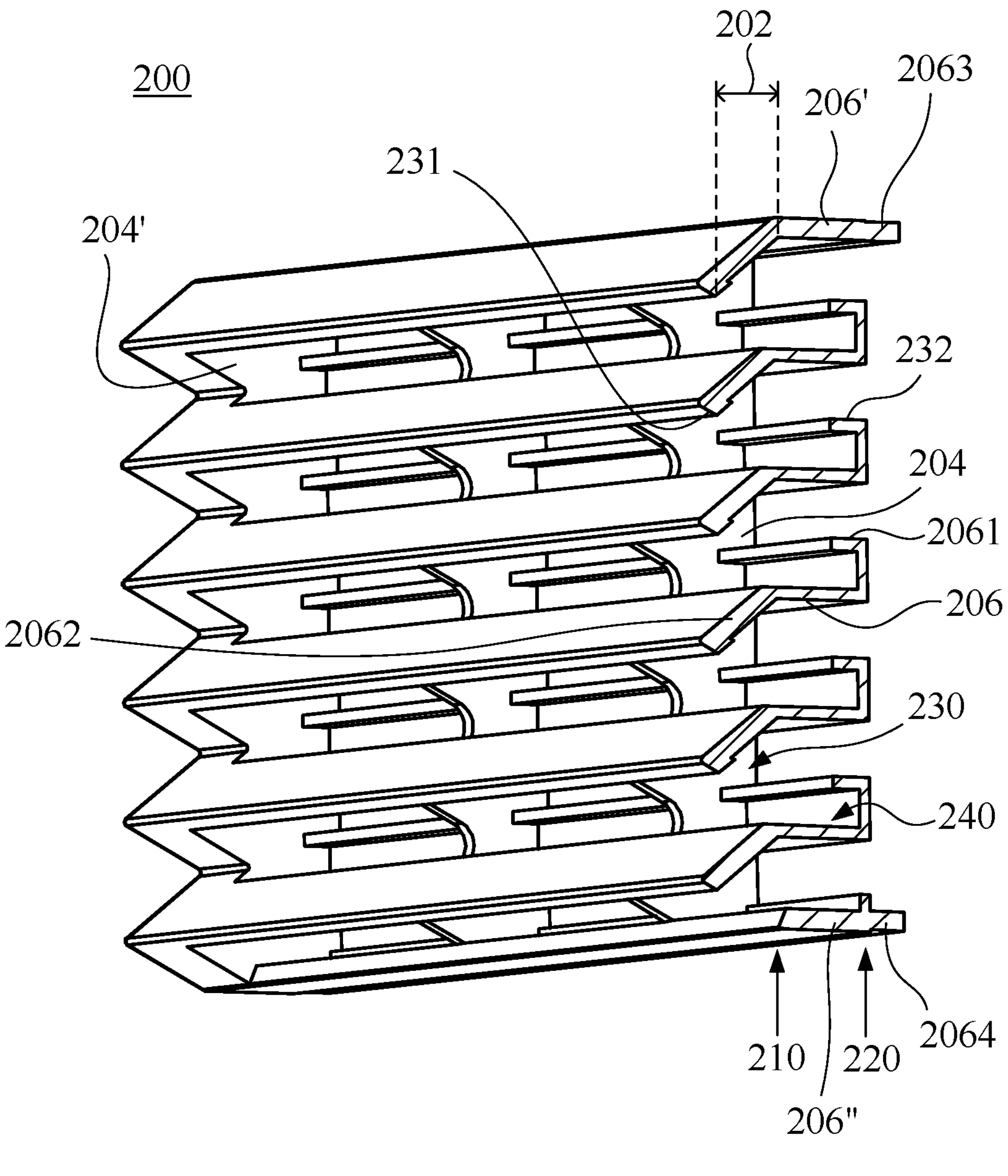
FIG. 5 is a perspective sectional schematic diagram of a pre-interception device according to a second implementation form of some embodiments.
Figure 6:
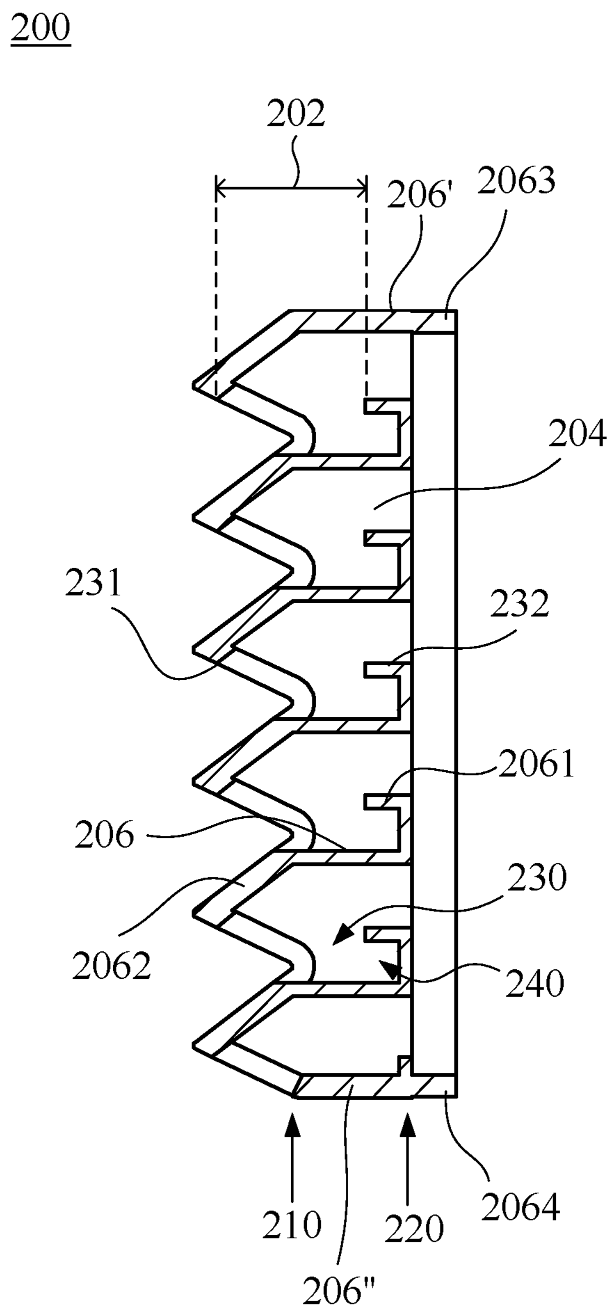
FIG. 6 is a sectional schematic diagram of the implementation form in FIG. 5.
Figure 7:
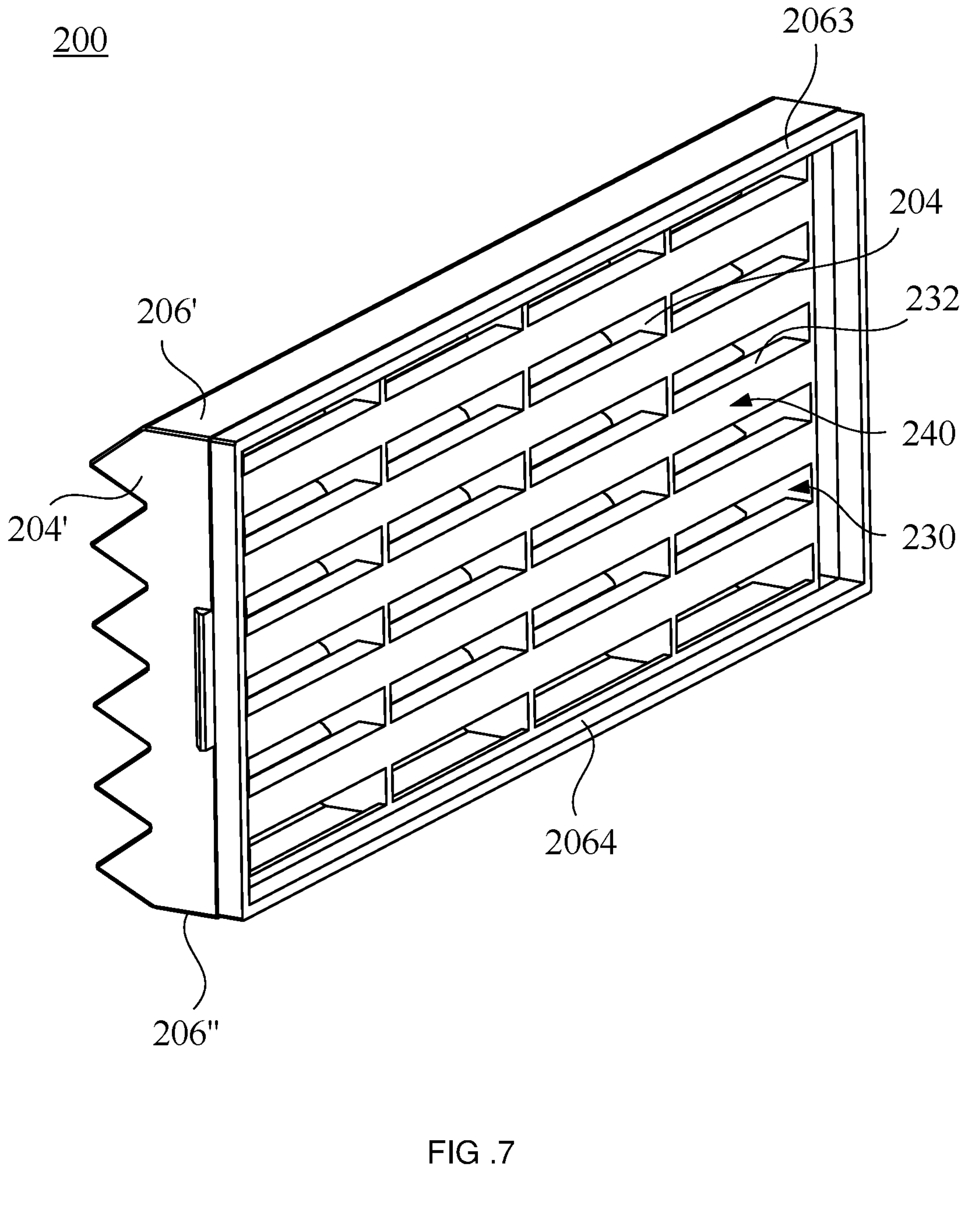
FIG. 7 is a perspective schematic diagram from a rear perspective of the implementation form in FIG. 5.

Referring to FIG. 5, FIG. 6 and FIG. 7, FIG. 5 shows a perspective sectional schematic diagram of a pre-interception device according to a second implementation form of some embodiments, FIG. 6 shows a sectional schematic diagram of the implementation form in FIG. 5, and FIG. 7 shows a perspective schematic diagram from a rear perspective of the implementation form in FIG. 5.

A pre-interception device 200 of the second implementation form similarly includes individual diversion flow channels 230 in a stack, such that a fluid flowing into the pre-interception device 200 is diverted into the individual diversion flow channels 230, and foreign objects are intercepted by fluid lift sections 202 and interception portions 240. On the basis of the configuration of the diversion flow channels 230 in a stack, in each diversion flow channel 230, a first opening 231 is provided on a front end to form a part of an input portion 210, and a second opening 232 is provided on a rear end to form a part of an output portion 220. In each diversion flow channel 230, the first opening 231 is arranged to be lower than the second opening 232, the fluid lift section 202 is thus defined on the flow channel between the first opening 231 and the second opening 232, and the corresponding interception portion 240 is arranged at a position near the second opening 232 and located on a lower side of the second opening 232.

In the pre-interception device 200, a plurality of spacers 206 stacked at intervals can be supported by a plurality of ribs 204, so as to form a spaced arrangement. These ribs 204 include, for example but not limited to, borders 204' located on two end edges of the spacers 206 to further form the pre-interception device 200 by means of increasing a thickness. By connecting the individual spacers 206 by the ribs 204, the structure of the pre-interception device 200 is constructed, and the sizes of the individual diversion flow channels 230 are also defined. For example, the size of the corresponding diversion flow channel 230 gets large as a distance between two adjacent spacers 206 increases. Similarly, on the basis of the arrangement in a stack, front sections of these spacers 206 define the input portion 210, rear sections of these spacers 206 define the output portion 220, and two adjacent spacers 206 define each diversion flow channel 230 in between.

Regarding the corresponding interception portion 240 of each diversion flow channel 230, in the second implementation form, the rear section of the spacer 206 is provided with a reverse folding portion 2061 extending upward and protruding forward (toward the side of the input portion 210) to form the interception portion 240. Moreover, the front section of the spacer 206 is provided with an eaves portion 2062 obliquely extending downward and outward, so as to form a part of the input portion 210 together with the adjacent spacer 206. In some other applications, an upper surface of the eaves portion 2062 can be further configured with a textured structure or anti-slip layer, so as to provide a capturing ability against foreign objects in the fluid and to keep a portion of the foreign objects captured on the upper surface of the oblique portion 2062.

A spacer 206' on the uppermost layer is not provided with the reverse folding portion 2061, but is further provided with a first extension portion 2063. Correspondingly, a spacer 206" on the lowermost layer is not provided with the eaves portion 2062 obliquely extending downward and outward, but is further provided with a second extension portion 2064. In some applications, in addition to mounting with a housing of a back-end electronic apparatus, apart from connecting members for fastening or packing for assembly, the first extension portion 2063 and the second extension portion 2064 can also coordinate with the borders 204' to provide a position for arranging a filter net.

Furthermore, referring to FIG. 6, the position of the upper surface of the reverse folding portion 2061 can be arranged substantially (with a minute difference or even substantially equal to) on a lower edge (a lowermost position) of the eaves portion 2062. In addition to forming good fluid lift sections 202, the arrangement above is also beneficial for construction costs for the structure of the integrally formed pre-interception device 200.

Figure 8:
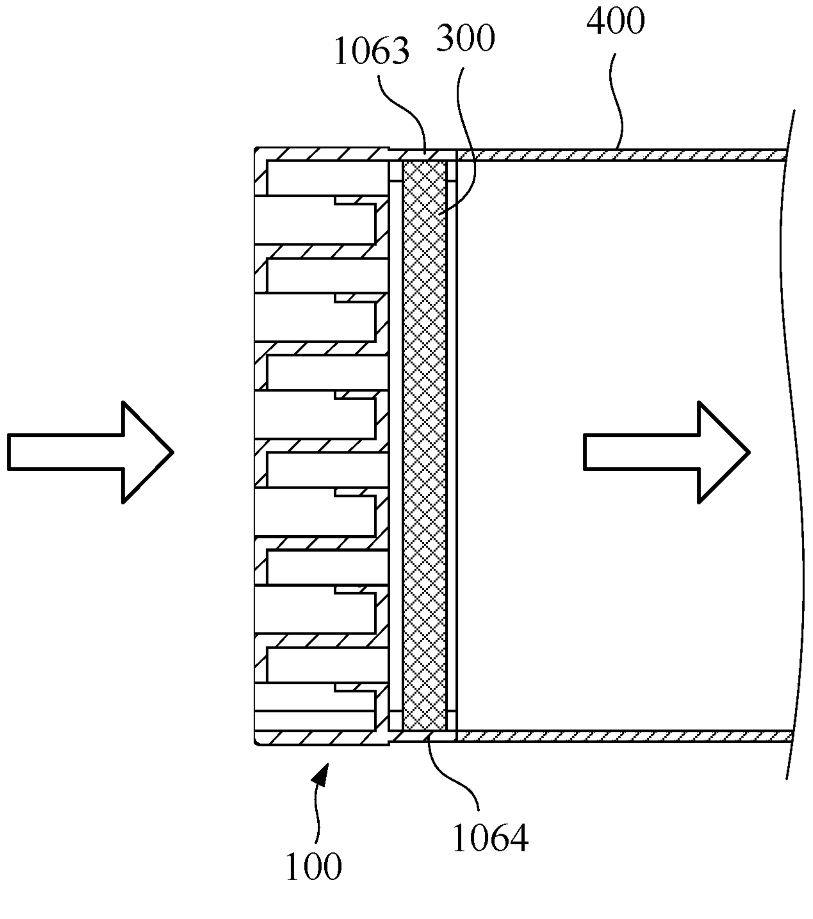
FIG. 8 is a sectional schematic diagram of a portion of an electronic apparatus provided with the pre-interception device of the first implementation form according to some embodiments.
Figure 9:
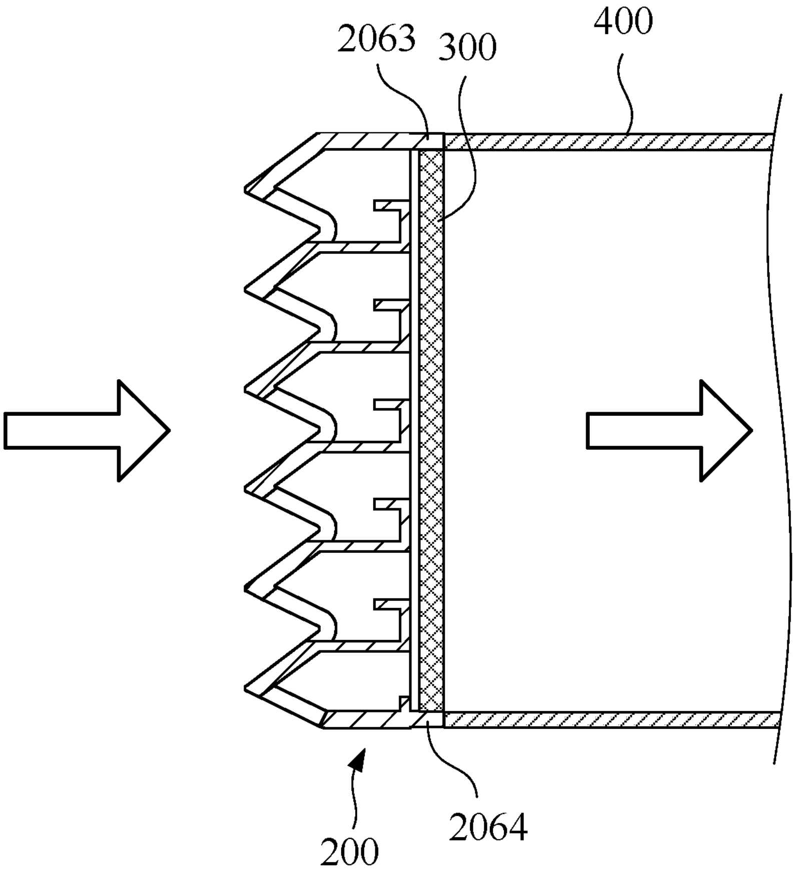
FIG. 9 is a sectional schematic diagram of a portion of an electronic apparatus provided with the pre-interception device of the second implementation form according to some embodiments.

Referring to both FIG. 8 and FIG. 9, FIG. 8 shows a sectional schematic diagram of a portion of an electronic apparatus provided with the pre-interception device of the first implementation form according to some embodiments, and FIG. 9 shows a sectional schematic diagram of a portion of an electronic apparatus provided with the pre-interception device of the second implementation form according to some embodiments.

Based on heat dissipation requirements or other requirements, the electronic apparatus has to introduce an external fluid (for example, air) for heat dissipation or supply the external fluid to an internal system that needs the fluid. With the configuration of the pre-interception device, the input external fluid can undergo preliminary filtering of a first stage to remove a part of foreign objects. The fluid output from the pre-interception device then flows through the filter net, and a fluid with a needed level of cleanliness is provided after filtering of a second stage by the filter net and then supplied into the electronic apparatus. With the assistance of the pre-interception device, foreign objects having certain special physical properties (for example, attributes such as being heavy in weight or large in volume) are first captured by the pre-interception device and do not enter the back-end filter net easily. Thus, the service life of the filter net with higher costs can be extended, and a frequency of replacing the filter net can also be effectively reduced.

As shown in FIG. 8 and FIG. 9, the pre-interception devices 100, 200 can be detachably (for example, by detachable connecting members by means of fastening, packing or other connection means) arranged on a fluid input side of an electronic apparatus 400. A connection portion between the pre-interception devices 100, 200 and the electronic apparatus 400 is provided with a filter net 300, so as to perform preliminary filtering of the first stage by the pre-interception devices and then perform filtering of the second stage by the filter net 300. On the basis of the structural configuration of the pre-interception devices 100, 200, a difference from the filter net 300 is that, foreign objects are free from the issue of getting caught in minute through hole structures (for example, minute through holes formed by a woven sheet of the filter net). Thus, the pre-interception devices 100, 200 are removed and foreign objects caught in the pre-interception devices 100, 200 can be easily removed by cleaning the pre-interception devices 100, 200 (for example, by impact with a high-speed fluid from an air spray gun). Accordingly, the pre-interception devices 100, 200 can be quickly cleaned and be repeatedly used.

In some application forms, the pre-interception devices 100, 200 can provide a configuration space for the filter net 300 by the first extension portions 1063, 2063 and the second extension portions 1064, 2064.

A combination of a pre-interception device and a filter net can be configured as a filtering system of an electronic apparatus. In such combined filtering system, a filter net is able to more fully practice the function of filtering out minute foreign objects in a way that the filtering ability of the filter net is not easily or quickly depleted by large foreign objects, allowing the filter net to fully practice the filtering function and effectively extend the service life of the filter net. The detachable pre-interception devices 100, 200 can be easily detached for cleaning. More particularly, in an application environment with severe conditions (for example, an environment with a large amount of dust, and where an excessive amount of foreign objects can be easily sucked in when an electronic apparatus is mounted near the ground), a filtering system of an electronic apparatus having such pre-interception device provides a better solution and has lower costs.

For example, it is proven experimentally that, when only a filter net is used to construct a filtering system in an electronic apparatus without a pre-interception device, in a state of use under an extreme full-speed wind volume (a flow speed formed by suction into the electronic apparatus is about 3.5 m/s), the filter net becomes unable to further implement a filtering operation (or it can be said that the breathability of the filter net is too low) after about one week. For a filter net used in the same environment and under the same specifications, when a filtering system is constructed by an electronic apparatus having the pre-interception device of the first implementation form in conjunction with the filter net, in a state of use under an extreme full-speed wind volume (a flow speed formed by suction into the electronic apparatus is about 3.5 m/s), a period up to which the filter net is no longer able to implement a filtering operation is extended to two weeks. Moreover, when a filter net is used in the same environment and under the same specifications, regarding a filtering system constructed by an electronic apparatus having the above pre-interception device in conjunction with the filter net, in a state of use under a common wind volume (a flow speed formed by suction into the electronic apparatus is about 1.75 m/s), a period up to which the filter net is no longer able to implement a filtering operation is even further extended to three months.

Accordingly, the pre-interception device practices a good pre-filtering effect for the entire filtering system, and the importance of the pre-interception device is further emphasized in certain special application environments. In addition, in continuation of the above, the service life of the filter net is significantly extended under certain wind speed configurations (for example, a setting of a common wind volume is adopted as air intake of an electronic apparatus), and foreign objects not subject to filtering by the filter net can be first captured in the pre-interception device, enabling the pre-interception device to achieve an outstanding interception effect.

In conclusion, in some embodiments of the present disclosure, a better foreign object filtering mechanism is provided by the pre-interception device and the filtering system using the pre-interception device. With the design of the device performing interception based on physical properties of foreign objects, a filtering effect is provided for a fluid passing through. Thus, when the pre-interception device is additionally combined with a filter net to form a filtering system, the burden on the filter net is further alleviated, hence extending a service life of the filter net as well as reducing construction costs and consumable replacement costs of the entire filtering system.

The present disclosure is illustrated by various aspects and embodiments. However, persons skilled in the art understand that the various aspects and embodiments are illustrative rather than restrictive of the scope of the present disclosure. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present disclosure shall be defined by the appended claims.

What is claimed is:

1. A pre-interception device, configured to intercept foreign objects in a fluid passing through, the pre-interception device comprising:

an input portion, configured for the fluid to flow in;

an output portion, configured for the fluid to flow out;

a plurality of diversion flow channels, in communication with the output portion and the input portion, configured to provide turning guidance for flow of the fluid, each of the diversion flow channels having a fluid lift section; and a plurality of interception portions, arranged on an edge of a path of the fluid lift section of each of the diversion flow channels, and configured to have at least a portion of the fluid flowing through the diversion flow channel to flow through the corresponding interception portion so as to form a turbulent flow field and to have foreign objects flowing through the diversion flow channel be captured in the interception portion.

2. The pre-interception device according to claim 1, wherein each of the diversion flow channels has a first opening arranged at the input portion and a second opening arranged at the output portion, the first opening is lower than the second opening, the fluid lift section is located between the first opening and the second opening, and the corresponding interception portion is arranged near the second opening and is located on a lower side of the second opening.

3. The pre-interception device according to claim 1, further comprising:

a plurality of spacers stacked at intervals, wherein front sections of the spacers define the input portion, rear sections of the spacers define the output portion, two adjacent spacers define the diversion flow channel in between, and the rear section of each of the spacers has a reverse folding portion extending upward and protruding forward to form the interception portion.

4. The pre-interception device according to claim 3, wherein the front section of each of the spacers has a portion vertically extending downward, so as to form a part of the input portion together with other adjacent spacers.

5. The pre-interception device according to claim 3, wherein the front section of each of the spacers has an eaves portion obliquely extending downward and outward, so as to form a part of the input portion together with other adjacent spacers.

6. The pre-interception device according to claim 5, wherein an upper surface of each of the eaves portions is provided with a textured structure or anti-slip layer.

7. The pre-interception device according to claim 3, wherein an uppermost layer of the spacers has a first extension portion, and a lowermost layer of the spacers has a second extension portion.

8. A filtering system of an electronic apparatus, comprising:

a pre-interception device, comprising:
- an input portion, configured for a fluid to flow in;
- an output portion, configured for the fluid to flow out and flow into the electronic apparatus;
- a plurality of diversion flow channels, configured to provide turning guidance for flow of the fluid, the diversion flow channels individually in communication with the output portion and the input portion, each of the diversion flow channels having a fluid lift section; and
- a plurality of interception portions, arranged on an edge of a path of the fluid lift section of each of the diversion flow channels, and configured to have at least a portion of the fluid flowing through the diversion flow channel to flow through the corresponding interception portion so as to form a turbulent flow field; and a filter net, arranged on an outer side of the output portion, and configured to allow the fluid flowing into the electronic apparatus to pass through.

9. The filtering system according to claim 8, wherein each of the diversion flow channels has a first opening arranged at the input portion and a second opening arranged at the output portion, the first opening is lower than the second opening, the fluid lift section is located between the first opening and the second opening, and the corresponding interception portion is arranged near the second opening and is located on a lower side of the second opening.

10. The filtering system according to claim 8, further comprising:

a plurality of spacers stacked at intervals, wherein front sections of the spacers define the input portion, rear sections of the spacers define the output portion, two adjacent spacers define the diversion flow channel in between, and the rear section of each of the spacers has a reverse folding portion extending upward and protruding forward to form the interception portion.

11. The filtering system according to claim 10, wherein the front section of each of the spacers has a portion vertically extending downward, so as to form a portion of the input portion together with other adjacent spacers.

12. The filtering system according to claim 10, wherein the front section of each of the spacers has an eaves portion obliquely extending downward and outward, so as to form a part of the input portion together with other adjacent spacers.

13. The filtering system according to claim 12, wherein an upper surface of each of the eaves portions is provided with a textured structure or anti-slip layer.

14. The filtering system according to claim 10, wherein an uppermost layer of the spacers has a first extension portion, a lowermost layer of the spacers has a second extension portion, and the filter net is arranged between the first extension portion and the second extension portion.

* * * * *